United States Patent [19]

Iguchi et al.

[11] Patent Number: 4,999,689
[45] Date of Patent: Mar. 12, 1991

[54] SEMICONDUCTOR MEMORY

[75] Inventors: Katsuji Iguchi, Yamatokoriyama; Masahiko Urai, Nara; Chiyako Masuichi, Toyonaka, all of Japan

[73] Assignee: Sharp Kabushiki Kaisha, Osaka, Japan

[21] Appl. No.: 566,866

[22] Filed: Aug. 13, 1990

Related U.S. Application Data

[63] Continuation of Ser. No. 267,335, Nov. 4, 1988, abandoned.

[30] Foreign Application Priority Data

Nov. 6, 1987 [JP] Japan .............................. 62-281382

[51] Int. Cl.⁵ ........................................... H01L 29/68
[52] U.S. Cl. .................................... 357/23.6; 357/51; 357/55
[58] Field of Search ................... 357/23.6, 55, 23.6 G, 357/51

[56] References Cited

U.S. PATENT DOCUMENTS 4,801,989 1/1989 Taguchi ............................ 357/23.6

FOREIGN PATENT DOCUMENTS

| 0164829 | 12/1985 | European Pat. Off. | 357/23.6 |
| 0176257 | 4/1986 | European Pat. Off. | 357/23.6 |
| 58-3260 | 1/1983 | Japan | 357/23.6 |
| 60-239053 | 11/1985 | Japan | 357/23.6 |
| 61-56445 | 3/1986 | Japan | 357/23.6 |
| 62-79659 | 4/1987 | Japan | 357/23.6 |
| 62-150765 | 7/1987 | Japan | 357/23.6 |
| 63-229745 | 9/1988 | Japan | 357/23.6 |
| 63-241961 | 10/1988 | Japan | 357/23.6 |

OTHER PUBLICATIONS

Chang et al., "Fabrication of V-MOS or U-MOS Random-Access Memory Cells with a Self-Aligned Word Line", Dec. 1979, *IBM Technical Disclosure Bulletin*, vol. 22, No. 7, pp. 2768-2771.

Richardson et al., "A Trench Transistor Cross-Point Dram Cell"; 1985, IEDM, p. 714.

M. Sakamoto et al., "Buried Storage Electrode (BSE) Cell for Megabit Drams"; 1985, IEDM, p. 710.

S. Nakajima et al., "An Isolation-Merged Vertical Capacitor Cell for Large Capacity Dram", 1985, IEDM; p. 240.

M. Wada et al., "A Folded Capacitor Cell (F.C.C.) for Future Megabit Drams", 1984, IEDM, p. 244.

M. Nagatomo et al., "A High Density 4M Dram Process Using Folded Bitline Adaptive Side-Wall Isolated Capacitor (FASIC) Cell"; 1986, IEDM, p. 144.

M. Taguchi et al., "Dielectrically Encapsulated Trench Capacitor Cell", 1986, IEDM, p. 136.

*Primary Examiner*—Andrew J. James
*Assistant Examiner*—Courtney A. Bowers

[57] ABSTRACT

A semiconductor memory having a plurality of memory cells each including a single capacitor and a single transistor for storing one bit are formed on a semiconductor substrate. Each terminal of the respective transistors of the memory cells are commonly connected to a common wiring portion, and the capacitor of each memory cell is disposed in a trench which is formed by forming a groove-like shape along the outer periphery of the semiconductor substrate for one or two adjacent transistors. The capacitor includes a first insulating film disposed over the inner wall surface of the trench, a first electrode formed entirely or partially on the surface of the first insulating film for being supplied with a predetermined voltage, a second insulating film disposed entirely over the surface of the first electrode, and a second electrode disposed on the second insulating film in an area corresponding to the inner sidewall surface of the trench and connected to the other terminal of the transistor.

16 Claims, 7 Drawing Sheets

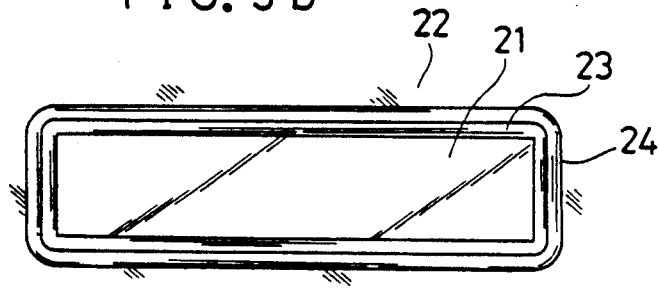
FIG. 3b
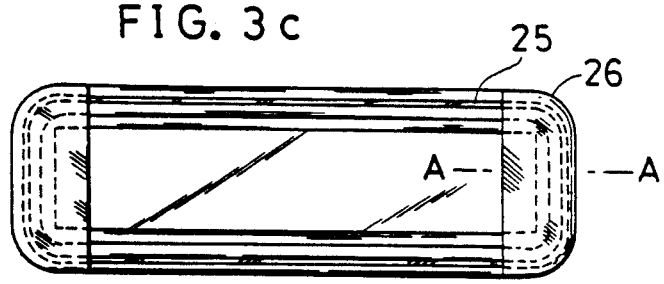
FIG. 3c
FIG. 4
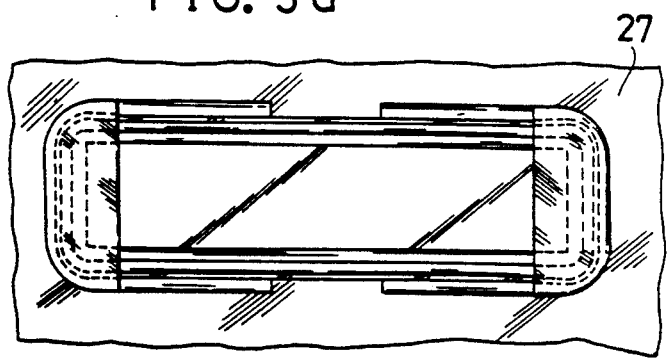
FIG. 3d
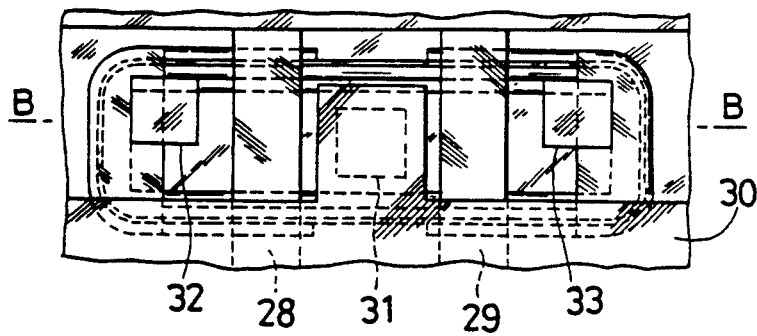
FIG. 3e

SEMICONDUCTOR MEMORY

This application is a continuation of application Ser. No. 07/267,335 filed on Nov. 4, 1988, now abandoned.

BACKGROUND OF THE INVENTION

1. Field of the Invention

The present invention relates to a semiconductor memory, and more particularly to a semiconductor memory of a DYNAMIC RANDOM ACCESS MEMORY (hereinafter abbreviated to as DRAM) having a plurality of storage capacity cells.

2. Description of the Prior Art

The bit capacity of DRAMs leading the higher integration race have experience a four-fold growth in the last three years. Presently 256 Kb (Kilobits) DRAMs and 1 Mb (Megabits) DRAMs are mainly being produced, and 4 Mb DRAMs are under development. It is expected that still larger capacity DRAMs, such as 16 Mb and 64 Mb DRAMs, will be developed in the near future. In the DRAMs currently being produced, one bit is stored in a memory cell having a single transistor (pass transistor) and a single capacitor. One cell of the 4 Mb DRAMs currently under development has an area of about 10 $\mu m^2$. With the increasing storage capacity, the cell area will gradually diminish to about 5 $\mu m^2$ (16 Mb) and then 2.5 $\mu m^2$ (64 Mb). In order to prevent radiation induced soft errors, a charge of 200 fc (femtocoulomb) or more must be stored by the capacitor of each cell, so that the capacitance of each cell is maintained at an order of 40 fF (femto-farad).

It is not feasible to hold the above capacitance on the silicon wafer surface alone for 4 Mb DRAMs. Therefore, the capacitor is produced in trenches which have a depth between 2 $\mu m$–8 $\mu m$ in the silicon wafer surface. A variety of DRAM cell structures have been proposed by utilizing such trenches.

Generally the design of DRAM memory cells, as much capacitance as possible should be maintained on the limited surface region without impairing the pass transistor in each cell and the characteristics of the cell-to-cell insulation. As a method for increasing the capacitance, it is theoretically possible to make a thinner dielectric between electrodes, or to employ materials which have a higher dielectric constant, so that the capacitance per unit area may be increased. At present, however, the dielectric suitable for practical use is limited to a $SiO_2$ film or a $SiO_2/Si_3N_4$ composite film only, and a maximum capacitance can be obtained from a 100 Å thick $SiO_2$ film from the standpoint of reliability. Accordingly, the capacitance of a capacitor (condenser) per unit area is about 3.5 $fF/\mu m^2$. Hence, a capacitor with an electrode area of approximately 11.4 $\mu m^2$ is required to maintain the capacitance at 40 fF.

Various cell structures have been proposed to form a capacitor with an electrode area larger than 10 $\mu m^2$ in a cell whose surface area is only approximately 10 $\mu m^2$.

More specifically, there has been proposed a cell structure which is called a trench transistor cell (TTC.) The TTC includes a capacitor formed in the lower portion of a trench and a vertical pass transistor formed in the upper portion of the trench (see IEEE IEDM: International Electron Devices Meeting, Transactions, p.714, Dec. 1985). The merits for this cell structure are as follows: the cell can dispense with the area necessary for the pass transistor and the bit line contact holes, the cell less affected by the short channel effect or the narrow channel effect of the pass transistor; there is no risk of punching through between the trenches; and the cell is highly tolerant against α-particle induced soft errors. In contrast the proposed cell structure has the following drawbacks: the cell requires the use of an expensive P/P+ epitaxial wafer very deep must be formed in the wafer, which results in very complicated manufacturing steps; and the ($\frac{1}{2}$) Vcc arrangement cannot be adopted which is effective in improving reliability of an insulating film in the capacitor.

There has also been proposed a cell structure which is called BSE (Buried/Storage Electrode Cell) (See IEEE IEDM, Transactions, p.710, Dec. 1985). In this cell structure, a capacitor and a pass transistor are formed in a coplanar surface. Because the BSE structure employs a P/P+ epitaxial substrate as with the above TTC structure, the BSE structure has the merits of no interaction between the capacitors, and a high tolerance against α-ray, etc. However, the demerits of the BSE structure are increased costs, and a lack of compatibility with the ($\frac{1}{2}$) Vcc arrangement, etc. In addition, the BSE manufacturing steps are more simple than the TTC manufacturing steps. Because the area available for the capacitor is very small in the BSE structure, it is expected that BSE will not be adapted for higher integration densities such as 16 Mb and 64 Mb.

Thus, because a P/P+ epitaxial substrate is used and a P+ portion of the substrate is utilized as a plate electrode of the capacitor, the TTC and BSE structures do not have an appreciable interaction between the capacitors, and high tolerance against α-ray, TTC and BSE structures have the demerits of increased cost, and a lack of compatibility with the ($\frac{1}{2}$) Vcc arrangement, etc. Furthermore, these type of cells are very disadvantageous when the capacitance in the trench is attempted to be increased because the capacitor trench is located at the center of each cell and an isolation region surrounds the outer side of the capacitor trench. Thereby, a structure results in which the circumference of the capacitor trench is shorter than the cell. As required by the subsequent process, the trench must have its side wall inclined to some degree, and the trench becomes V-shaped as a result. With this structure, therefore, the side area of the trench will not be increased even if a deeper trench is formed, and the capacitance cannot be made larger in proportion to the depth of the trench.

For this reason, it is necessary to make the circumference of the trench as long as possible, in order to form a capacitor with the largest practicable capacitance in a limited area. To this end, it is advantageous to form a trench around the cell, and have the cell isolation region and the capacitor region formed inside the trench.

One of these types of cells, a FCC (Folded Capacitor Cell) has been proposed (see IEEE IEDM, Transactions, p.244, Dec. 1984). With this cell structure, although the circumference of the capacitor portion is nearly comparable with the structure of the BSE cell, the trench is V-shaped and this results in the side area of the trench being increased with larger depths. However, problems still exist in the various manufacturing processes such as the cell-to-cell isolating method at the trench bottom, the impurity implanting method to the trench side wall, etc. and achieving in lower tolerances against α-ray than the BSE structure.

There has also been proposed a cell structure, as shown in FIG. 7, which is called an IVEC (Isolation Merged Vertical Capacitor Cell) (see IEEE IEDM, Transactions, p.240, Dec. 1984). In FIG. 7, trenches 43, 43', 43" are formed to surround memory cell regions 42 and 42' of a silicon substrate 41, and capacitor electrodes 46 and 46' connected to drain regions 45 and 45' of pass transistors via insulating films ($SiO_2$ films) 44, 44' and 44" are formed in the trenches 43, 43' and 43". The capacitor electrodes (doped polycrystalline silicon) 46 and 46' are also contiguous with the plate electrodes (doped polycrystalline silicon) 48, 48' and 48" via capacitor insulating films ($SiO_2$ films) 47 and 47'. Designated at 49 and 49' are word lines serving as gate electrodes of the pass transistors, 50 and 50' are source regions of the pass transistors, 51 is an interlayer insulating film, and 52 is a bit line connected to the source regions 50.

This IVEC cell is very effective in increasing the capacitance of the capacitor, because the capacitor is disposed around the cell and has a larger circumference. Also, capacitor separation by the insulating films reduces the interference between the cells. Further, since the capacitor electrodes are isolated from the silicon substrate by the insulating films, tolerance against α-ray is high. However, with the capacitor electrodes disposed on the side faces of the pass transistors via the insulating films, there is a possibility that a channel may be developed in the side faces of the pass transistors and eventually the pass transistors may leak when the capacitor electrodes are at a higher potential and the bit line is at lower potential. Although the IVEC cell has excellent characteristics as mentioned above, this structure faces inherent problems of leakage of the pass transistors in the course of future developments for the higher integration densities such as 16 Mb and 64 Mb.

It is the object of the present invention to provide a semiconductor memory, such as DRAM, whose individual memory cells include a single capacitor and a single transistor, which can prevent leakage of the transistor even in a memory having a large memory capacity.

SUMMARY OF THE INVENTION

According to the embodiment of the present invention, a semiconductor memory is provided wherein a plurality of memory cells each including a single capacitor and a single transistor for storing one bit are formed on a semiconductor substrate, one terminal of a respective transistor of the memory cell is commonly connected to a common wiring portion, and the capacitor of each memory cell is formed in a trench by digging the semiconductor substrate in a groove-like shape along the outer periphery of one or two adjacent transistors. The capacitor includes a first insulating film formed over the inner wall surface of the trench, a first electrode formed entirely or partially over the surface of the first insulating film and supplied with a predetermined voltage, a second insulating film formed over the surface of the first electrode, and a second electrode formed on the second insulating film in an area corresponding to the inner sidewall surface of the trench and connected to the other terminal of the transistor.

The semiconductor memory according to the embodiments of the present invention can overcome the above-mentioned shortcomings in the prior art. More specifically, since the capacitor is formed in the trench around a memory cell region on the semiconductor substrate, the first electrode is disposed via the first insulating film on the peripheral side face of the transistor formed in the memory cell region, and the second electrode is disposed to cover the first electrode via the second insulating film, it is possible to constantly prevent a channel from being produced on the peripheral side face of the transistors. Hence, leakage of the transistor is prevented, even when the second electrode is at higher potential than the first electrode. Since the capacitor can have a longer circumference, it is also possible to increase its capacitance even with a smaller area of the memory cell. Further, since all adjacent capacitors are isolated by the first insulating film, interference between the memory cells can be prevented. In addition, high tolerance is expected against α-ray induced soft errors.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 3a–3e are illustrates the sequential nature of the process used to manufacture the memory cell showing a second embodiment of the present invention;

FIG. 4 is a sectional view taken along the line A—A in FIG. 3(c);

DESCRIPTION OF THE PREFERRED EMBODIMENT

A semiconductor substrate employed in the present invention is formed of a material such as silicon, gallium-arsenic or indium-phosphor, preferably of p-type or n-type.

A trench in the present invention has an opening in the range of 1.5–0.4 μm, and preferably in the range of 1.0–0.5 μm. The trench depth is preferably in range of 1–6 μm with the aspect ratio preferably not being greater than 5. The trench is convergent in configuration and has an inclination angle in the range of 1°–5°, and preferably equal to 3°.

Further, the trench has a circumference in the range of 2–10 μm, and preferably in the range of 2–5 μm.

First and second insulating films employed in the present embodiment are formed of a material such as $SiO_2$, $Si_3N_4$ or $Ta_2O_5$ (or a combination thereof). The first insulating film has a thickness in the range of 500–1500 Å, and preferably equal to 1000 Å, while the second insulating film has a thickness in the range of 50–200 Å, and preferably equal to 100 Å.

First and second electrodes employed in the present embodiment are formed of a thin film of phosphor-doped polycrystalline silicon, arsenic-doped polycrystalline silicon, or the like.

In particular, the second electrode has a film thickness preferably in the range of 0.05–0.2 μm.

A common wiring portion employed in the present embodiment is formed of a material such as an aluminum-silicon-copper alloy or tungsten silicide. Then, a connection between the second electrode and the other terminal of a transistor is made with the same material as the common wiring portion.

Hereinafter, an embodiment of the present invention will be described with reference to the drawings. It should be noted that the scope of the present invention is not restricted by the following embodiment.

FIG. 1 shows a first embodiment of the present invention which is applied to a memory cell for a 16 Mb DRAM.

Figure 1A:
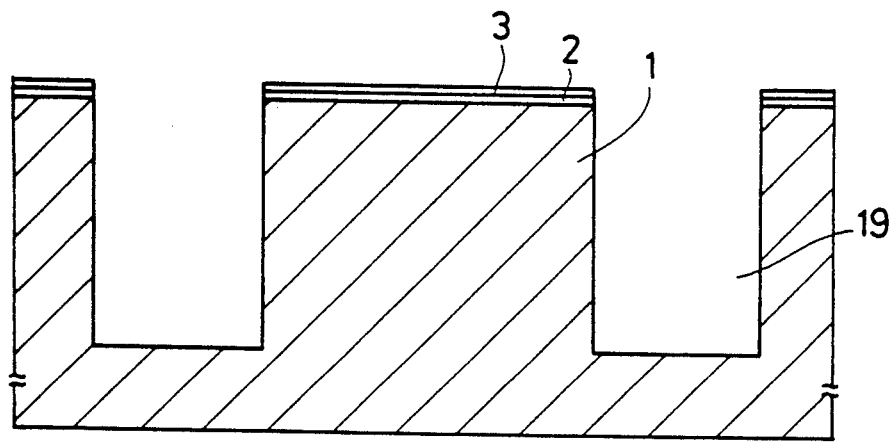
FIG. 1a–1g are illustrates the sequential nature of the process used to manufacture the memory cell showing a first embodiment of the present invention.
Figure 1B:
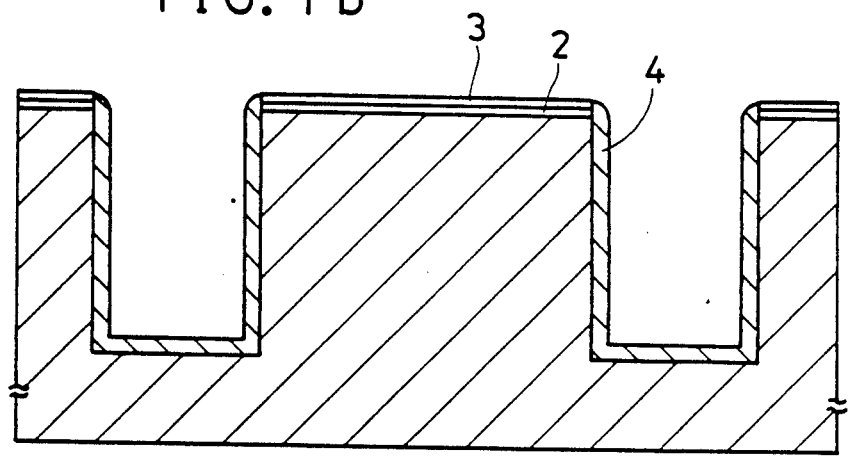
Figure 1C:
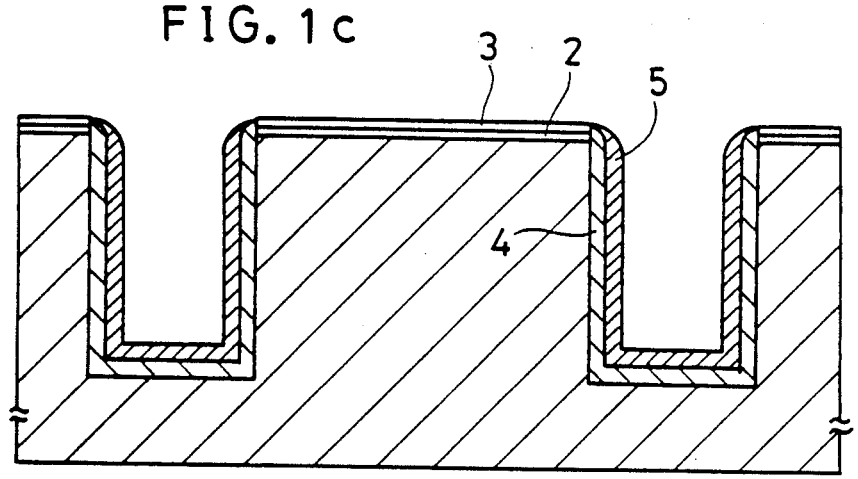
Figure 1D:
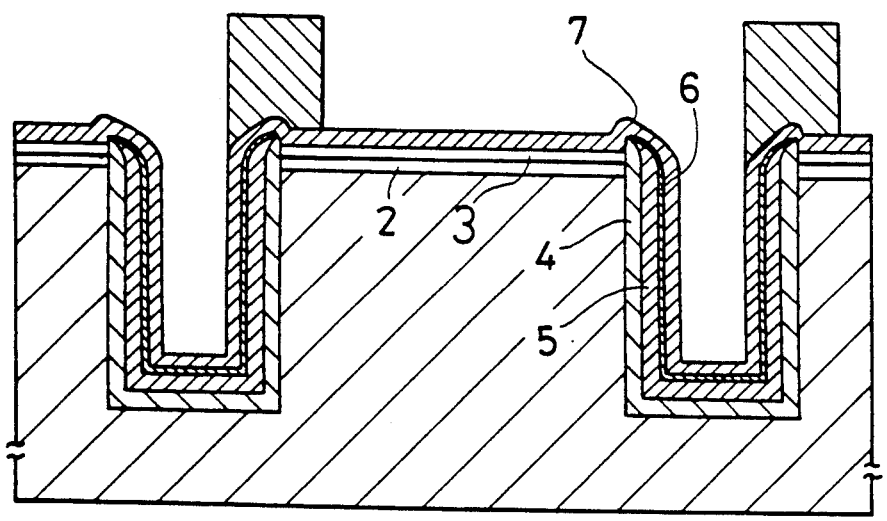
Figure 1E:
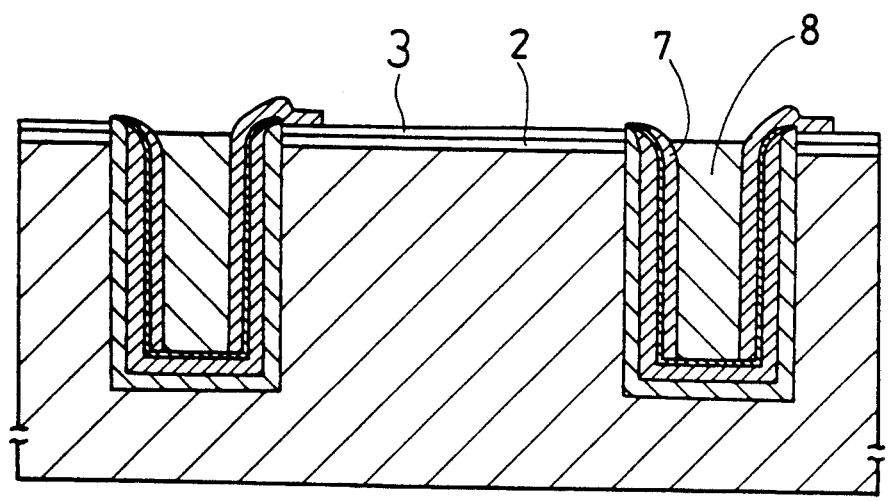
Figure 1F:
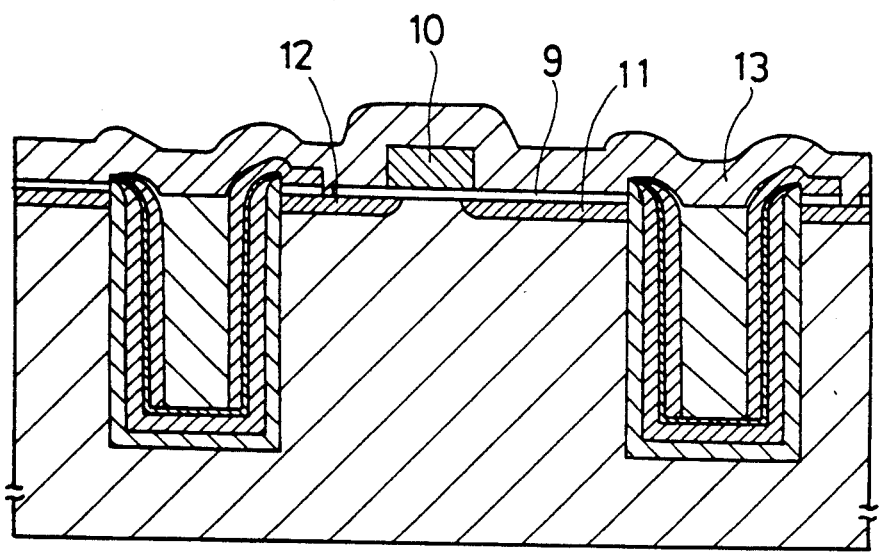
Figure 1G:
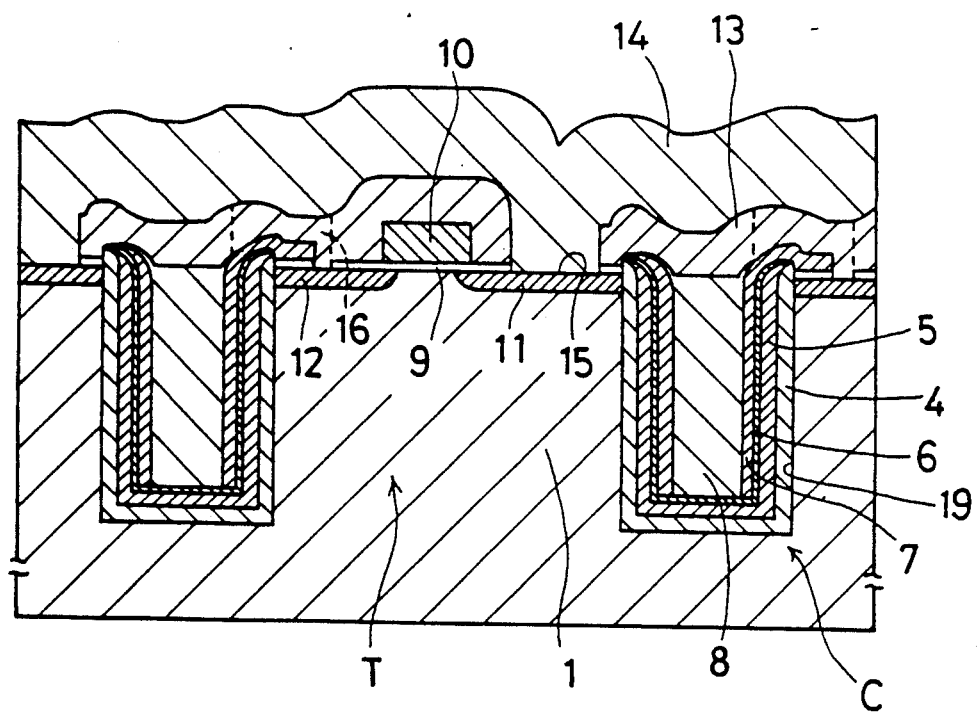
Figure 2:
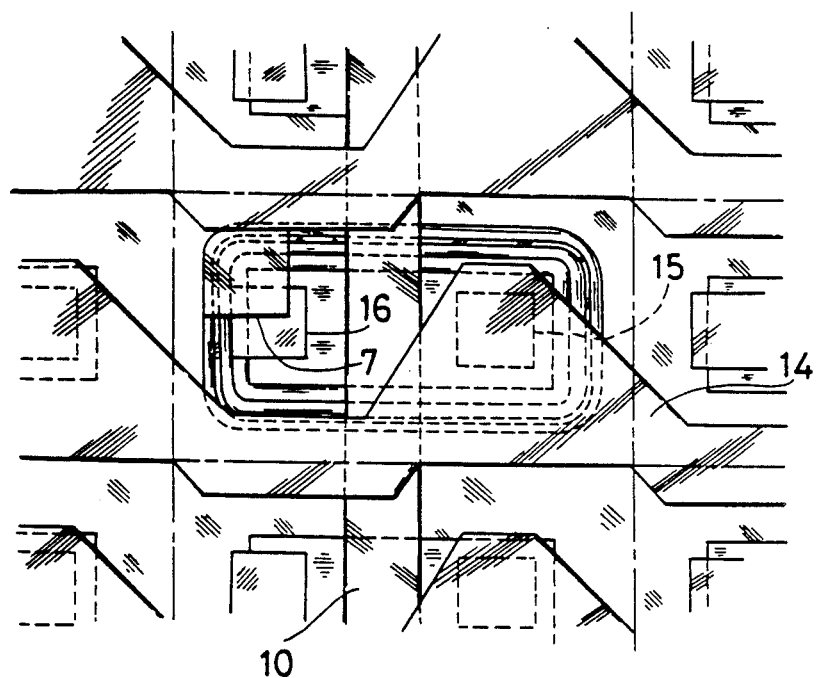
FIG. 2 is an explanatory view of an essential portion of the first embodiment.

In FIGS. 1(g) and 2, the memory cell includes a single capacitor C and a single n-channel MOS transistor (pass transistor) T, for storing one bit.

The transistor T is disposed on a p-type silicon substrate 1 via a gate oxide film 9 formed of $SiO_2$, and consists of a gate electrode 10, which serves as a word line and is formed of a two-layered film including phosphor-doped polycrystalline silicon and tungsten silicide, a source (source region) 11 formed of an arsenic diffused layer, and a drain (drain region) 12 formed of an arsenic diffused layer.

On the other hand, the capacitor C is formed in a trench 19 dug in the form of groove around the memory cell region. The sidewall of the transistor T is covered with a capacitor plate electrode 5 (hereinafter referred to simply as a plate electrode) which is formed of a phosphor-doped polycrystalline silicon thin film and serves as a first electrode via a $SiO_2$ film 4 (first insulating film) having a film thickness of 0.1 $\mu$m. More specifically, the trench 19 has a V-shape with an inclination angle of 3°, and the $SiO_2$ film 4 is formed over the inner wall surface of the trench. The plate electrode 5 is then formed on the $SiO_2$ film 4. On the inner side of the plate electrode 5, a capacitor electrode 7 which serves as a second electrode, is formed of a thin film of phosphor-doped polycrystalline silicon via a $SiO_2$ film 6 (second insulating film) having a film thickness of 0.015 $\mu$m. The capacitor electrode 7 has a thickness of 0.1 $\mu$m and hence can maintain higher tolerance against $\alpha$-induced soft errors.

The source 11 of the transistor T is connected to a plurality of memory cells via the common wiring portion 14 which serves as a bit line. Designated at 15 is a contact hole used for this connection. The bit line 14 is formed of an aluminum-silicon-copper alloy.

The capacitor electrode 7 is connected to the drain 12 of the transistor T via a contact hole 16 by using an aluminum-silicon-copper alloy.

The plate electrodes 5 of the many memory cells are commonly connected via a common wiring portion (not shown) which serves as a fixed potential supply line, and are supplied with a constant voltage from outside the memory cell regions.

At this time, the applied voltage may be set equal to one half the supply voltage Vcc so that the plate electrode 5 is subjected to a voltage of ($\frac{1}{2}$) Vcc, or is set equal to 0 V or below. In any case, the optimum value can be selected to optimize the device characteristics. As an alternative, after forming the first insulating film 4, it is possible to etch away the bottom of the film 4 for connecting the first electrode 5 to the substrate 1, so that the first electrode 5 is held at the same potential (e.g., 0 V) as the substrate 1.

The method of manufacturing will be described below.

First, after oxidizing the surface of the p-type silicon substrate 1 by heating and forming a $SiO_2$ thin film 2, a $Si_3N_4$ thin film 3 is deposited thereon by the LP (low-pressure) CVD method, and a resist pattern is then formed by the photolithography method. Both the thin films 2 and 3 are etched away by employing the resist as a mask. Subsequently, trench etching of the substrate 1 is carried out to form the trench 19. After peeling off the resist and cleaning the substrate through a cleaning step, boron is diffused into all the inner wall surfaces of the trench 19 [see FIG. 1(a)]. Then, after depositing a $SiO_2$ film over the substrate surface by the LPCVD method, the $SiO_2$ film on the substrate surface is removed by the etch-back method. More specifically, after painting a resist on the $SiO_2$ film and applying RIE-etching to the whole resist surface, the $SiO_2$ film, which serves as a underlying film for the resist is etched away so that the resist is left only in the trench 19. As a result, only the $SiO_2$ film on the top surface of the substrate 1 is removed except for the film in the trench 19. In this way, a $SiO_2$ film 4 is left only over the inner wall surface of the trench 19 [see FIG. 1(b)]. Then, a phosphor-doped polycrystalline silicon thin film is deposited over the substrate surface, and the deposited silicon thin film on the top surface of the substrate is removed by the etch-back method, so that a phosphor-doped polycrystalline silicon layer 5 is left only on the $SiO_2$ film 4 [see FIG. 1(c)]. Subsequently, the polycrystalline silicon film 5 is thermally oxidized to form a $SiO_2$ film 6 for the capacitor, followed by the formation of a phosphor-doped polycrystalline silicon thin film 7 [see FIG. 1(d)].

Next, the polycrystalline silicon thin film 7 on the surface is etched away by the RIE-etching method except for the trench side wall and the limited top surface region while leaving the polycrystalline silicon thin film 7 only on the side wall surface of the trench and on the small top surface region. Then, after depositing a $SiO_2$ film 8 by the LPCVD method in the trench, the $SiO_2$ film on the top surface of the substrate is removed by the etchback method [see FIG. 1(e)]. After peeling off the $Si_3N_4$ film 3 and the $SiO_2$ film 2 on the substrate surface, a gate oxide film 9 of $SiO_2$ is formed by the thermal oxidization method. A two-layered film including phosphor-doped polycrystalline silicon and tungsten silicide is deposited on the gate oxide film 9 which is then etched to form the gate electrode 10. Subsequently, after implanting arsenic ions, the substrate is subjected to a heat treatment for forming n+ diffusion layers 11 and 12 which serve as the source and drain of the n-channel MOS transistor, respectively. Thereafter, a BPSG (boron-phosphor-silicaglass) film 13 is deposited which serves as an interlayer insulating film [see FIG. 1(f)].

Figure 6A:
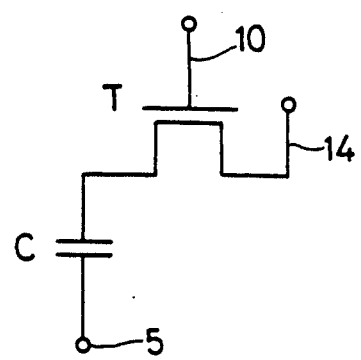
FIG. 6(a) and 6(b) are equivalent circuit diagrams of the first and second embodiments of the present invention, respectively.

Next, the contact hole 15 for connecting the bit line 14 and the source 11 of the pass transistor T, as well as the contact hole 16 for connecting the phosphor-doped polycrystalline silicon 7 which serves as the capacitor electrode and the drain 12 of the pass transistor T are bored [see FIG. 2], and an aluminum-silicon-copper alloy is deposited in a predetermined pattern [see FIG. 1(g)]. At this time, as shown in FIG. 2, the bit line pattern covers the contact hole 15, but the contact hole 16 is left exposed. Specifically, while the aluminum-silicon-copper alloy is etched, the contact hole 16 is separated from the bit line 14 and the lower portion of the contact hold 16 is filled with this alloy. FIG. 6(a) shows an equivalent circuit of the resulting memory cell.

The memory cell formed through the foregoing process has an area of 1.75 $\mu$m $\times$ 3 $\mu$m = 5.25 $\mu$m$^2$ per cell and the minimum size of the pattern used has an order of 0.5 $\mu$m.

The trench 19 formed in this embodiment has a width of 1.0 μm at the opening edge, a depth of 3 μm, and a sidewall inclination angle of 3°. Although it is difficult to measure a film thickness of the capacitor insulating film 6, the film thickness is estimated to be approximately 150 Å based on a capacitance evaluation of a planar type capacitor which has been formed under the same conditions.

Eventually, the memory cell of this embodiment has a capacitance of 45 fF. Thus, it was possible to realize a very large capacitance even with a relatively shallow trench having an aspect ratio of 3. Further, a hold time of carriers stored in the memory cell is comparable to that of the conventional planar type capacitor. Therefore, the memory cell of this embodiment is suitable for practical use.

Also, there are no problems with respect to punch through or leakage between the capacitors.

In short, according to the memory cell of this embodiment, within the trench which surrounds the memory cell region, there is disposed the plate electrode 5 on the trench inner wall surface via the $SiO_2$ film 4 and the capacitor electrode 7 on the inner side via the capacitor insulating film 6. Therefore, the side face of the pass transistor is always covered by the plate electrode 5 via the $SiO_2$ film 4. The voltage applied to the plate electrode 5 is held less than at least ($\frac{1}{2}$) Vcc, and the formation of the side face channel is restrained so that the margin in the cell design becomes very wide. In other words, a 16 Mb DRAM can be formed having a memory cell area less than 5.25 $\mu m^2$ with an aspect ratio of the trench less than 5. In addition, by reducing the minimum size of the pattern used to an order of 0.25 μm, the memory cell can be fabricated with an area not larger than 2.5 $\mu m^2$ and applied to a 64 Mb DRAM as well. Further, it is expected that this memory cell is less affected by interference and leakage between the cells, and is also highly resistant against α-ray induced soft errors. Accordingly, this memory cell has a high practical value and will be suited to the future development of DRAMs with higher integration densities.

Next, a second embodiment of the present invention will be described as follows in which is applied to a memory cell for a 16 Mb DRAM the structure.

FIG. 3 shows the sequential nature of the manufacturing process of the memory cell of this embodiment. In the first embodiment, individual memory cells are separated by the trenches, and a set of adjacent memory cells share a bit line contact. Note that FIG. 3 illustrates the manufacturing steps.

Figure 3A:
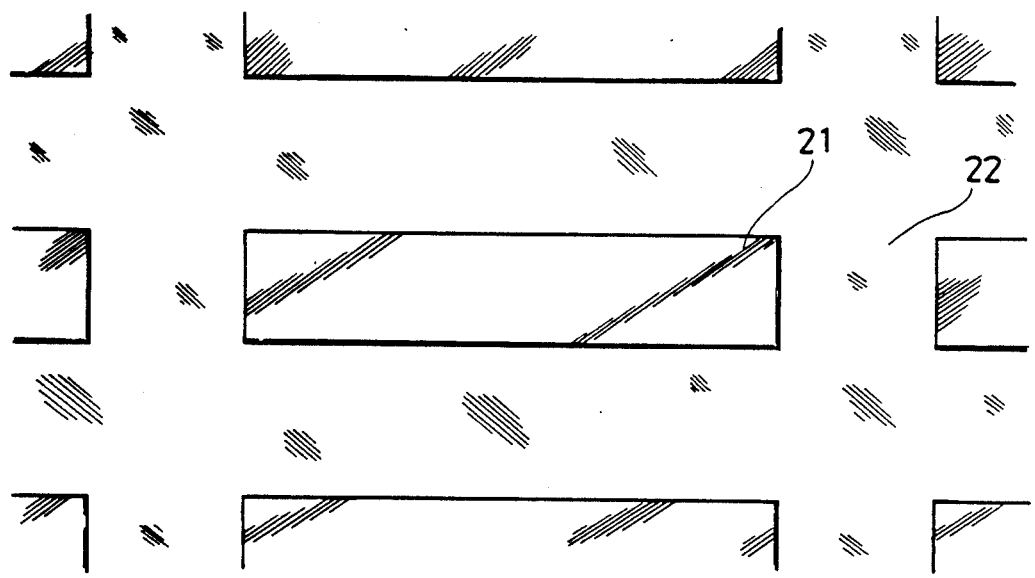

First, in FIG. 3, after oxidizing the surface of a p-type silicon substrate 21 and depositing a $Si_3N_4$ film, the silicon substrate 21 is etched by employing resist as a mask to form a trench 22 having a width of 1 μm. Then, boron is diffused into all of the inner wall surfaces of the trench 22 [see FIG. 3(a)]. Subsequently, after depositing a $SiO_2$ film, the $SiO_2$ film on the top surface is removed by the etch back method. Then, a phosphor-doped polycrystalline silicon thin film is deposited all over the substrate surface, and the deposited silicon thin film on top surface of the substrate is removed by the etch-back method, so that a phosphor-doped polycrystalline silicon layer 24 which serves as a plate electrode is left only over the inner wall surface of the trench. Accordingly, a $SiO_2$ film 23, which serves as a first insulating film, and the polycrystalline silicon layer 24 are formed only over the trench inner wall [see FIG. 3(b)]. Then, the polycrystalline silicon layer 24 is thermally oxidized to form a capacitor insulating film 25 of $SiO_2$, and the formation of this layer is followed by the deposition of a phosphor-doped polycrystalline silicon layer 26 which serves as a capacitor electrode. The polycrystalline silicon layer is etched away by the RIE-etching method while leaving the polycrystalline silicon layer only on a portion of the cell surface [see FIG. 3(c)]. FIG. 4 showns a section taken along the line A—A in FIG. 3(c). Then, after etching the polycrystalline silicon layer 26 on a portion of the trench sidewall through the resist process and depositing a $SiO_2$ film, the etch-back method is carried out to build $SiO_2$ 27 in the trench [see FIG. 3(d)].

Figure 5:
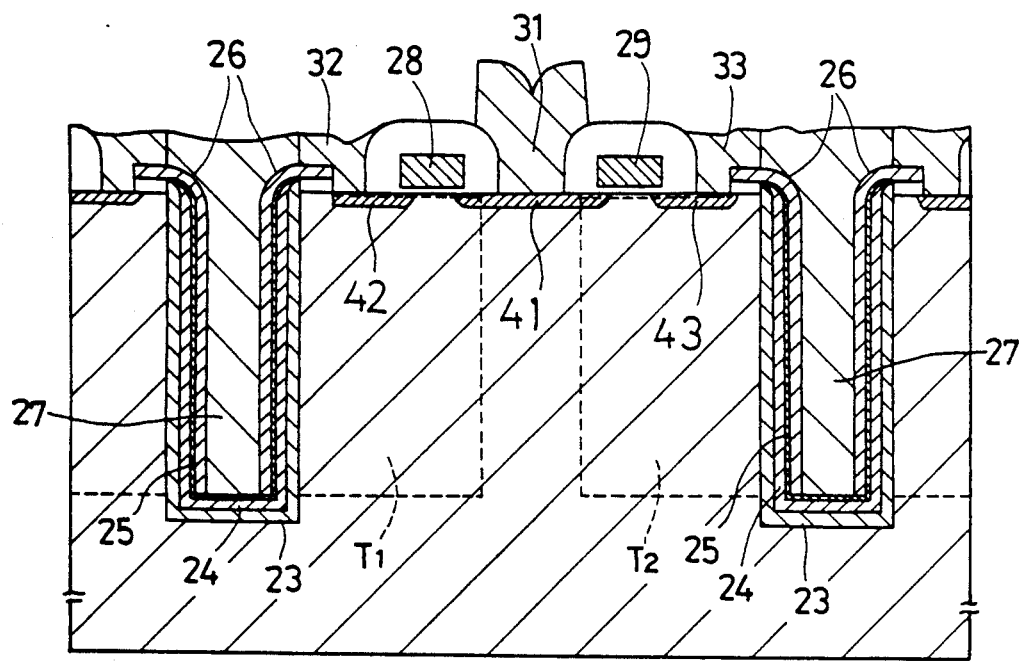
FIG. 5 is a sectional view taken along the line B—B in FIG. 3(e)
Figure 6B:
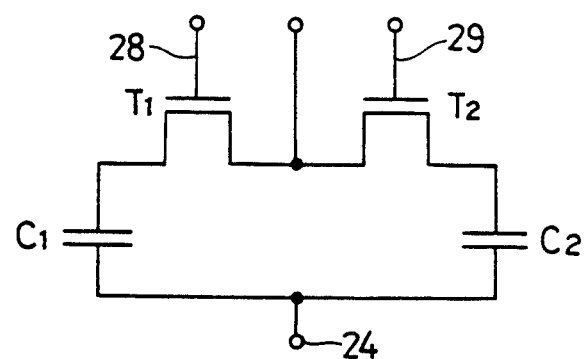
Figure 7:
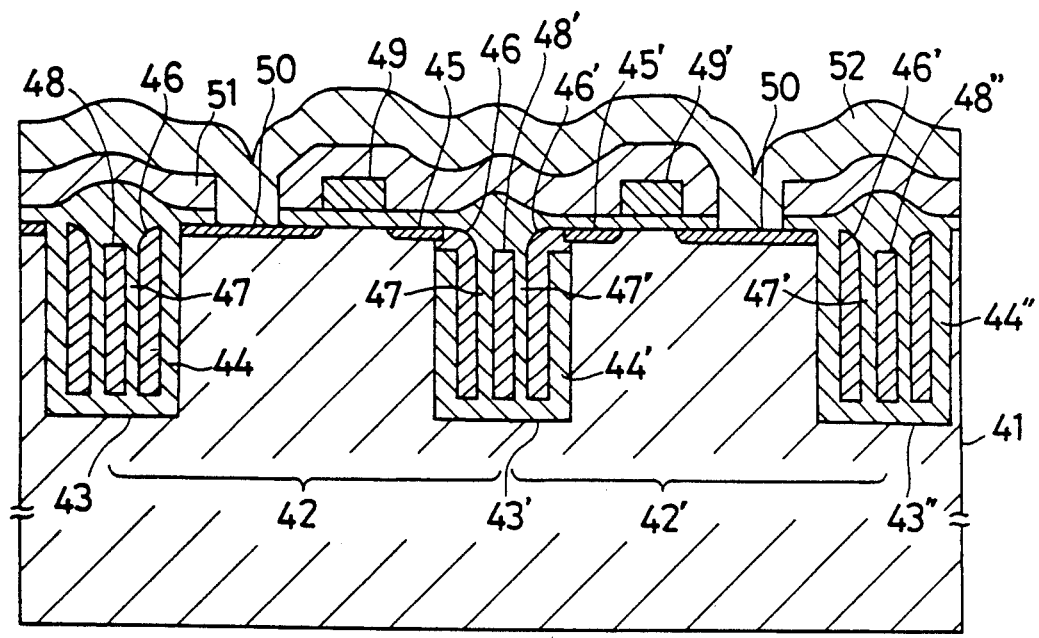
FIG. 7 is an explanatory view for the construction of a memory cell showing the prior art.

After peeling off the $SiO_2$ film on the substrate surface, a gate oxide film is formed by thermal oxidization, a two-layered film including phosphor-doped polycrystalline silicon and tungsten silicide is deposited on the gate oxide film and then etched to form the gate electrodes 28 and 29 which serve as word lines. Subsequently, after implanting arsenic ions, the substrate is subjected to a heat treatment for forming the source region 41 and drain regions 42 and 43 of the n-channel MOS transistor. Thereafter, a BPSG film serving as an interlayer insulating film is deposited and subjected to a heat treatment. Then, a contact hole 31 for connecting a bit line 30 formed of an aluminum-silicon-copper alloy and a common source 41 of two pass transistors T1 and T2, as well as contact holes 32 and 33 for connecting the capacitor electrode 26 and drains 42 and 43 of the pass transistors are bored. Subsequently, an aluminum-silicon-copper alloy is deposited in a predetermined pattern to form the bit line 30. At this time, as in the above first embodiment, the contact holes 32 and 33 are not included in the bit line pattern, and are separated from the bit line [see FIGS. 3(e) and 5]. FIG. 5 shows a section of this memory cell. An equivalent circuit of the memory cell is shown in FIG. 6(b). In FIG. 6(b), C1 and C2 indicate capacitors.

The memory cell formed through the foregoing process has an area of 1.75 μm × 2.25 μm = 3.94 $\mu m^2$ per cell having a minimum size of 0.5 μm. The trench has a width of 1.0 μm at the opening edge and a depth of 5 μm. Other process conditions are similar to those in the above first embodiment, and the memory cell of this embodiment has a capacitance of 40 fF. This memory cell is also excellent with respect to the other characteristics described for the first embodiment. Furthermore, this embodiment enables a 16 Mb DRAM to be formed in a smaller chip than the case formed by the first embodiment.

As fully described above, according to the present invention, a capacitor is formed in a trench defined around a memory cell region on a semiconductor substrate, a first electrode is disposed via a first insulating film on the peripheral side face of a transistor formed in the memory cell region, and a second electrode is disposed to cover the first electrode via a second insulating film. Therefore, even when the second electrode is at a higher potential than the first electrode, it is possible to prevent a channel from being produced on the peripheral side face of the transistor. Hence, leakage of the transistor is prevented. Since the capacitor can have a longer circumference, it is also possible to increase its capacitance even with a smaller area of the memory cell. Further, since all adjacent capacitors are isolated by the insulating film, interference between the memory cells can be prevented. Another advantageous characteristic is that a high tolerance is expected against α-ray induced soft errors, because the particular electrodes are formed of thin films. Consequently, the present memory cell has a very high practical value in terms of the future development of DRAMs with higher integration densities.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor memory having a plurality of memory cells comprising:
   a semiconductor substrate;
   a plurality of capacitor and transistor pairs corresponding to each of said memory cells, each of said pairs being capable of storing one bit;
   a common wiring bus formed from an alloy of a first material and disposed on said substrate for commonly connecting the source terminals of said transistors; and
   a plurality of trenches formed by a groove-like shape along an outer periphery of one or two adjacent transistor for receiving said capacitors, each of said capacitors including,
      a first insulating film disposed on an inner wall surface and a bottom surface of each of said trenches,
      a plate electrode formed on the top surface of said first insulating film for applying a predetermined voltage,
      a second insulating film disposed over the surface of said plate electrode,
      a capacitor electrode disposed on an area of said second insulating film and connected to the drain terminal of one of said one or two adjacent transistor by said alloy of said first material, the area of said second insulating film corresponding to an area on said inner sidewall surface of said trench and an area on a top surface outside said trench, and
      a third insulating film disposed on said capacitor electrode and said second insulating film.

2. A semiconductor memory according to claim 1, wherein said plate electrode is disposed on said first insulating film along the entire inner wall surface of said trench.

3. A semiconductor memory according to claim 1, wherein said plate electrode is disposed on an inner sidewall surface of said first insulating film which is disposed over the inner sidewall surface of said trench.

4. A semiconductor memory according to claim 1, wherein said plurality of trenches are formed along the outer periphery of each said transistors.

5. A semiconductor memory according to claim 1, wherein said plurality of trenches are formed along the outer periphery of two adjacent transistors, and two adjacent transistors share one terminal which is commonly connected to said common wiring bus.

6. A semiconductor memory according to claim 1, wherein each of said plurality of trenches has an opening width between 0.4 and 1.5 $\mu$m, a depth between 1 and 6 $\mu$m, and an aspect ratio of said depth to said opening width is less than or equal to 5.

7. A semiconductor memory according to claim 1, wherein each of said plurality of trenches has a circumferential length between 2 and 10 $\mu$m.

8. A semiconductor memory according to claim 1, wherein each of said plurality of trenches has such a convergent or a V-shaped configuration having a width that becomes wide towards an opening of said trench.

9. A semiconductor memory according to claim 8, wherein the inner sidewall surface of said trench has an inclination angle between 1 and 5 degrees with respect to a plane normal to the surface of said opening of said trench.

10. A semiconductor memory according to claim 1, wherein said semiconductor substrate comprises a Si material.

11. A semiconductor memory according to claim 10, wherein said first and second insulating films are $SiO_2$, $Si_3N_4$, $Ta_2O_5$, or a combination of $SiO_2$, $Si_3N_4$ and $Ta_2O_5$.

12. A semiconductor memory according to claim 1, wherein said semiconductor substrate is GaAs or InP.

13. A semiconductor memory according to claim 11, wherein said first insulating film has a film thickness between 500 and 1500 Å.

14. A semiconductor memory according to claim 11, wherein said second insulating film has a film thickness between 50 and 200 Å.

15. A semiconductor memory according to claim 1, wherein said first material is an Al.Si.Cu alloy or a tungsten silicide.

16. A semiconductor memory according to claim 10, wherein said plate and capacitor electrodes comprise phosphor-doped polycrystalline silicon.

* * * * *